(12) United States Patent
Kuo et al.

(10) Patent No.: US 10,209,296 B2
(45) Date of Patent: *Feb. 19, 2019

(54) CIRCUIT AND METHOD FOR TESTING RF DEVICE AND RF DEVICE WITH BUILT-IN TESTING CIRCUIT

(71) Applicant: Alpha Networks Inc., Hsinchu (TW)

(72) Inventors: Rong-Fa Kuo, Hsinchu (TW); Ming-Chih Peng, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/865,730

(22) Filed: Jan. 9, 2018

(65) Prior Publication Data

US 2018/0128871 A1 May 10, 2018

Related U.S. Application Data

(63) Continuation of application No. 14/804,899, filed on Jul. 21, 2015, now Pat. No. 9,964,586.

(30) Foreign Application Priority Data

Aug. 29, 2014 (TW) .............................. 103129993 A (51) Int. Cl.
*G01R 31/28* (2006.01)
(52) U.S. Cl.
CPC ................................ *G01R 31/2822* (2013.01)
(58) Field of Classification Search
CPC ..... G01R 31/2822; G01R 31/28; G01R 31/02
See application file for complete search history.

(56) References Cited

U.S. PATENT DOCUMENTS

| 6,943,739 | B1 | 9/2005 | Rousu et al. | |
|---|---|---|---|---|
| 7,554,335 | B2 | 6/2009 | Han et al. | |
| 9,519,021 | B2* | 12/2016 | Gilbert | A61B 18/1206 |
| 9,531,485 | B1 | 12/2016 | Kuo | |
| 2005/0070268 | A1 | 3/2005 | Hakkinen et al. | |
| 2007/0013462 | A1* | 1/2007 | Fan | H03H 7/0115 333/185 |
| 2007/0245179 | A1 | 10/2007 | Noda | |
| 2009/0184719 | A1 | 7/2009 | Ko et al. | |

(Continued)

FOREIGN PATENT DOCUMENTS

| CN | 101119119 | 2/2008 |
|---|---|---|
| TW | I354793 | 12/2011 |
| TW | I386650 | 2/2013 |

*Primary Examiner* — Son Le
*Assistant Examiner* — Akm Zakaria
(74) *Attorney, Agent, or Firm* — WPAT, PC (57) ABSTRACT

In a testing circuit performing a testing operation to detect an RF circuit characteristic, a first filter unit is provided, having a first external terminal electrically coupled to a testing signal and a second external terminal electrically coupled to an RF circuit of the RF device. The first filter unit is configured to allow the testing signal to enter the RF circuit while blocking an RF signal transmitted in the RF circuit from entering the testing circuit. In addition, a testing-result informing unit is provided, having an external input electrically coupled to the first external terminal, and generating an informing signal, which indicates a condition of the RF circuit according to an electric level at the external input.

15 Claims, 5 Drawing Sheets

(56) References Cited

U.S. PATENT DOCUMENTS

2010/0013455 A1 1/2010 Kelma et al.
2010/0123475 A1 5/2010 Ko et al.
2012/0100813 A1* 4/2012 Mow .................. H04B 17/12
                                                       455/67.12
2012/0297263 A1* 11/2012 Taya ................ G01R 31/2884
                                                       714/733
2013/0154711 A1* 6/2013 Kuttenkuler ..... H03K 17/08128
                                                       327/326

* cited by examiner

CIRCUIT AND METHOD FOR TESTING RF DEVICE AND RF DEVICE WITH BUILT-IN TESTING CIRCUIT

FIELD OF THE INVENTION

The present invention relates to a testing method and associated circuit, and more particularly to a testing method and associated circuit performing a testing operation to determine a radiofrequency (RF) circuit characteristic of an RF device. The present invention also relates to an RF device built therein a testing circuit for determining an RF circuit characteristic thereof.

BACKGROUND OF THE INVENTION

Conventionally, if a testing procedure is performed to determine an RF circuit characteristic of an RF device while a radiofrequency (RF) circuit of the RF device, e.g. an antenna, is working, it is likely to interfere the function of the RF circuit and thus adversely affect the communication quality. Therefore, testing an RF circuit to determine the RF circuit characteristic of the RF device is generally conducted in a specific testing mode instead of a normal working mode. In other words, the RF circuit characteristic is measured by a testing process but not in a normal process. It would cause inconvenience for testing operations. Moreover, for a DC-Ground RF circuit whose impedance characteristic is grounded in direct-current (DC) frequency but non-grounded in other frequency, a short-circuit problem cannot be screened out by a DC voltage test. Likewise, for a DC-Open RF circuit whose impedance characteristic is open-circuit in direct-current (DC) frequency but non-open-circuit in other frequency, a disconnection problem cannot be screened out by a DC voltage measurement.

The above-mentioned defects make maintenance of an RF circuit problematic.

SUMMARY OF THE INVENTION

Therefore, an object of the present invention is to provide a testing method in which condition detection can be accomplished in simultaneous testing and normal operations of the RF circuit without interfering the operations with each other.

The present invention further provides a testing circuit whose output allows the RF circuit characteristic to be readily realized.

The present invention further provides an RF device having a built-in testing circuit which is capable of performing a self-testing operation out of factory.

In an aspect, the present invention provides a testing circuit which performs a testing operation to detect an RF circuit and determine an RF circuit characteristic of an RF device. The testing circuit comprises: a first filter unit having a first external terminal electrically coupled to a testing signal and a second external terminal electrically coupled to an RF circuit of the RF device, wherein the first filter unit is configured to allow the testing signal passing therethough to enter the RF circuit while blocking an RF signal transmitted in the RF circuit from passing therethough and entering the testing circuit; and a testing-result informing unit having an external input electrically coupled to the first external terminal of the first filter unit, and generating an informing signal, which indicates the RF circuit characteristic, according to an electric level at the external input of the testing-result informing unit.

Preferably, the testing circuit further comprises a second filter unit having a third external terminal electrically coupled to the testing signal and a fourth external terminal electrically coupled to the first external terminal of the first filter unit.

In another aspect, the present invention provides an RF device comprises an RF circuit and a testing circuit as described above for detecting the RF circuit characteristic.

In a further aspect, the present invention provides a testing method for determining an RF circuit characteristic of an RF device. The testing method comprises: electrically coupling a testing circuit to the RF circuit in the RF device; transmitting a testing signal through both the testing circuit and the RF circuit while blocking an RF signal transmitted in the RF circuit from entering the testing circuit; generating an informing signal in response to the testing signal transmitted through the testing circuit and the RF circuit; comparing the informing signal with a default signal to obtain a comparison result; and determining the RF circuit characteristic according to the comparison result.

In an embodiment, the testing method further comprises: updating the default signal for a subsequent testing operation if the RF circuit characteristic is determined to be a normal condition according to the comparison result.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

The invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
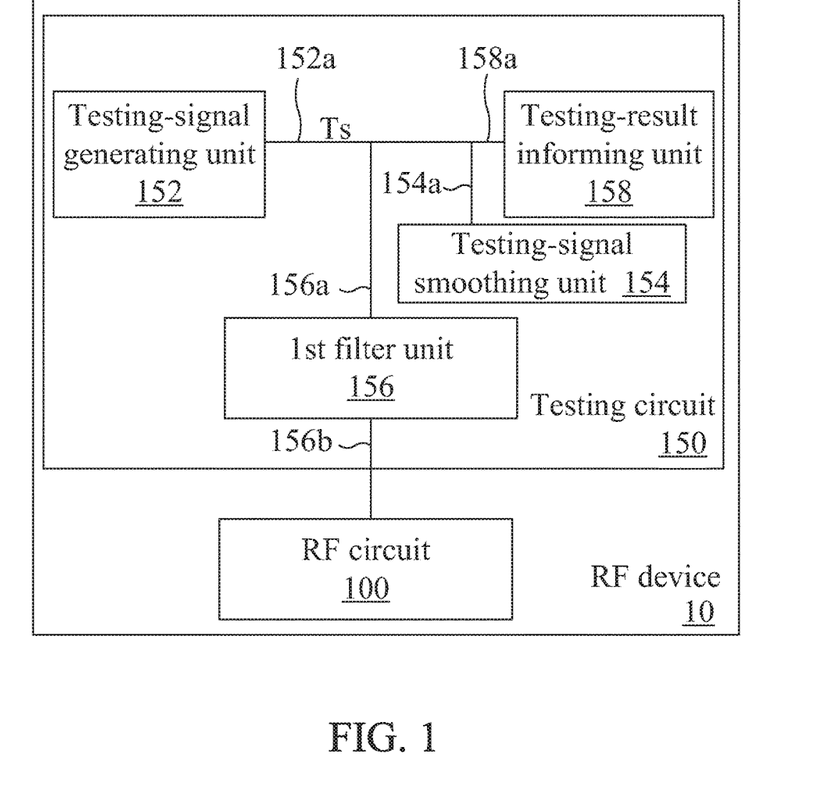
FIG. 1 is a circuit block diagram schematically illustrating an RF device according to an embodiment of the present invention.

Please refer to FIG. 1, in which an embodiment of an RF device according to the present invention is shown. In this embodiment, the RF device 10 includes an RF circuit 100 and a testing circuit 150 performing a testing operation for determining an RF circuit characteristic of the RF device. The RF circuit 100 functions for receiving or transmitting RF signals. An antenna is one of the examples. The testing circuit 150 includes a testing-signal generating unit 152, a testing-signal smoothing unit 154, a first filter unit 156 and a testing-result informing unit 158. The testing-signal generating unit 152 has a signal output 152a, from which a testing signal Ts is outputted. The testing-signal smoothing unit 154 has a terminal 154a electrically coupled to the testing-signal generating unit 152 for receiving the testing signal Ts. The first filter unit 156 has an external terminal 156a, which is referred to as a first external terminal, and an external terminal 156b, which is referred to as a second external terminal, wherein the first external terminal 156a is electrically coupled to the terminal 154a of the testing-signal smoothing unit 154 and the signal output 152a so as to receive the testing signal Ts, while the second external terminal 156b is electrically coupled to a predetermined test point of the RF circuit 100. The testing-result informing unit 158 has an external input 158a, which is electrically coupled to the terminal 154a of the testing-signal smoothing unit 154, the signal output 152a, and the external terminal 156a. The testing-result informing unit 158 generates an informing signal according to an electric level at the external input 158a.

Preferably, the testing-signal generating unit 152 exhibits properties of a low output impedance voltage source or a high output impedance current source. The testing signal Ts may be itself or include a digital signal. For example, the testing signal Ts may be continuously high, like a constant DC voltage. In other words, it is a digital signal, each bit of which is "1". In another example, the testing signal Ts may be continuously low, like a DC grounded voltage. In other words, it is a digital signal, each bit of which is "0". Alternatively, the testing signal Ts may be alternately high and low, like a middle or low frequency signal. In other words, it is a digital signal having alternate "1" and "0" bits, i.e. 1, 0, 1, 0, 1, 0 . . . . Furthermore, a variety of digital signals having different duty cycles and/or waveforms can also be used as the testing signal. The waveforms, for example, may be but not limited to square waves, triangle waves or sine waves.

Furthermore, the first filter unit 156 exhibits properties of high impedance at high frequency and low impedance at middle or low frequency. The so-called high frequency indicates a specific band of frequency around the frequency of the radio-frequency signal, which is generally higher than about 300 MH, and will be referred to as "high band" hereinafter. On the other hand, the so-called middle or low frequency indicates a specific band of frequency around the frequency of the testing signal Ts generated by the testing-signal generating unit 152, which is generally lower than a quarter of the high band frequency, and will be referred to as "middle/low band" hereinafter. As such, during the operation of the radio-frequency (RF) circuit 100, the RF signal transmitted in the RF circuit 100 would not affect the operation of the testing circuit 150 due to the blocking effect of the first filter unit 156. In contrast, the first filter unit 156 will not block the testing signal Ts, so the RF circuit 100 serves one of the transmission paths of the testing signal Ts. Therefore, the testing signal is allowed to be transmitted from the testing circuit to the RF circuit and from the RF circuit to the testing circuit through the first filter unit 156, i.e., the first filter unit 156 is configured to allow bidirectional transmitting of the testing signal. Consequently, the impedance change of the RF circuit 100 will cause a change of an electric level of the testing circuit 150, e.g. the electric level received by the testing-result informing unit 158 through the external input 158a.

The testing-signal smoothing unit 154 used herein functions for temporary energy storage and wave filtration for smoothing the waveform of the testing signal passing therethrough. Depending on practical designs, the testing-signal smoothing unit 154 may stand alone or be incorporated into a filter unit of the testing circuit 150. Embodiments and examples will be given as follows for illustrating the designs and modifications.

Figure 2:
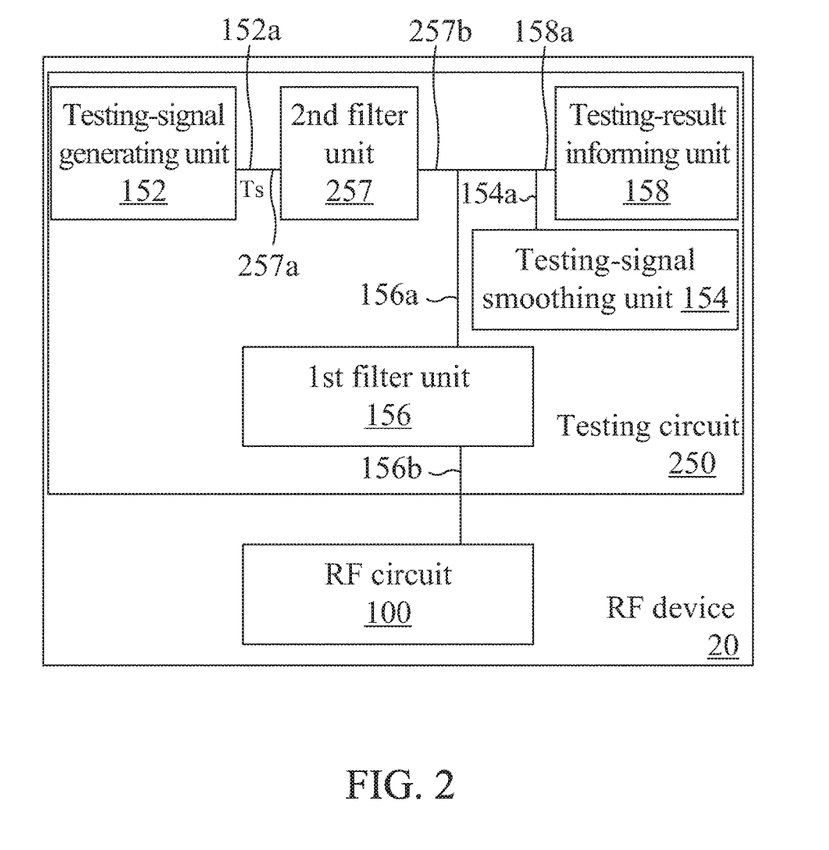
FIG. 2 is a circuit block diagram schematically illustrating an RF device according to another embodiment of the present invention.

Please refer to FIG. 2, which is a circuit block diagram schematically illustrating an RF device according to another embodiment of the present invention. Comparing the embodiment illustrated in FIG. 2 with that illustrated in FIG. 1, the testing circuit 250 of the RF device 20 shown in FIG. 2 includes a second filter unit 257, which does not exist in the RF device 10 shown in FIG. 1. The second filter unit 257 is electrically coupled to the first filter unit 156 and the testing-signal generating unit 152, and has an external terminal 257a, which is referred to as a third external terminal, electrically coupled to the testing-signal generating unit 152 for receiving the testing signal Ts, and an external terminal 257b, which is referred to as a fourth external terminal, electrically coupled to the external terminal 156a of the first filter unit 156 and the external input 158a of the testing-result informing unit 158. The second filter unit 257 is capable of providing an improved high-frequency isolating effect for the testing-signal generating unit 152 so as to protect the operation of the testing-signal generating unit 152 from being affected by the RF signal transmitted in the high-power RF circuit 100. The second filter unit 257 accomplishes the aforementioned objective with a required impedance effect in the specified high band. Preferably, the second filter unit 257 provides an impedance effect similar to or better than the first filter unit 156. From another viewpoint, both the first filter unit 156 and the second filter unit 257 can be low-pass filters or band-pass filters. Alternatively, they may be one low-pass filter and one band-pass filter. As long as the objectives can be achieved, it is not intended to limit the types of the filter units.

In addition to the abovementioned difference, the circuitry and operational principle of the RF device 20 are similar to those of the RF device 10 illustrated in FIG. 1, so they will not be redundantly described herein. It is to be noted that in spite a testing-signal generating unit is provided in each of the embodiments for generating a testing signal, the testing signal can alternatively be provided by an external device. Then there would be no need to dispose a testing-signal generating unit in the testing circuit or even in the RF circuit.

Figure 3:
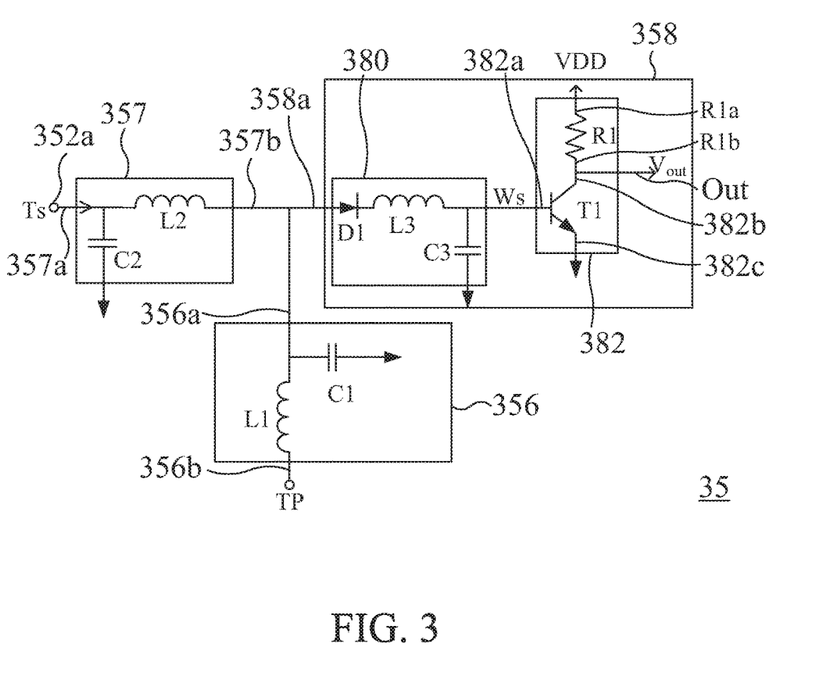
FIG. 3 is a circuit diagram schematically illustrating a testing circuit according to an embodiment of the present invention.

For example, referring to FIG. 3, a circuit block diagram schematically illustrating an RF device according to another embodiment of the present invention is shown. In this embodiment, the testing circuit 35 mainly includes a signal output 352a, a first filter unit 356, a second filter unit 357 and a testing-result informing unit 358, and there is no independent testing-signal generating unit existing in this embodiment of RF device. Instead, the signal output 352a is electrically coupled to an external testing-signal generating unit (not shown), from which the testing signal Ts is received and provided for the testing circuit 35.

In this embodiment, the first filter unit 356 includes an inductor L1 and a capacitor C1. The inductor L1 has one terminal electrically coupled to the external terminal 356b and then to a testing point TP of the RF circuit (not shown). Another terminal of the inductor L1, i.e. the external terminal 356a of the first filter unit 356, one terminal of the capacitor C1, the external terminal 357b of the second filter unit 357 and the external input 358a of the testing-result informing unit 358 are electrically coupled to one another. Another terminal of the capacitor C1 is electrically coupled to ground. The second filter unit 357 includes an inductor L2 and a capacitor C2. One terminal of the inductor L2, i.e. the external terminal 357a of the second filter unit 357, is electrically coupled to the signal output 352a and one terminal of the capacitor C2. Another terminal of the inductor L2, i.e. the external terminal 357b of the second filter unit 357, is electrically coupled to the external input 358a of the testing-result informing unit 358 and the external terminal 356a of the first filter unit 356. Another terminal of the capacitor C2 is electrically coupled to ground.

Herein, the capacitors C1 and C2 work together as the testing-signal smoothing unit 154. That is, the capacitors C1 and C2 work together to provide temporary energy-storing and wave-filtering effects for providing a direct-current (DC) bias signal required by the testing-result informing unit 358 at a subsequent stage.

As shown, the testing-result informing unit 358 in this embodiment includes a rectifying unit 380 and a DC detecting unit 382. The rectifying unit 380 is electrically coupled to the external input 358a, performs a rectifying operation for the electric level at the external input 358a, and outputs a corresponding rectified signal Ws. The DC detecting unit 382 is electrically coupled to the rectifying unit 380, receives the rectified signal Ws, and determines the contents of the informing signal to be outputted by the testing-result informing unit 358 according to the rectified signal Ws.

In this embodiment, the rectifying unit 380 includes a diode D1, an inductor L3 and a capacitor C3. The anode of the diode D1 is electrically coupled to the external input 358a, and the cathode is electrically coupled to one terminal of the inductor L3. Another terminal of the inductor L3 is electrically coupled to one terminal of the capacitor C3, and another terminal of the capacitor C3 is grounded. The DC detecting unit 382 includes a transistor T1 and a resistor R1. The resistor R1 functions for voltage drop, and may be replaced with another passive or active element, e.g. transistor or MOSFET. A control terminal 382a of the transistor T1 is electrically coupled to both the inductor L3 and the capacitor C3 of the rectifying unit 380, through which the rectified signal Ws from the rectifying unit 380 is received to determine whether to conduct the electric path between a first path 382b and a second path 382c. The second path 382c is grounded, and the first path 382b, as well as the terminal R1b of the resistor R1, is electrically coupled to the external output Out, where an output electric level Vout is outputted by the testing-result informing unit 358 as the informing signal. Another terminal R1a of the resistor R1 is electrically coupled to the working voltage VDD.

In this embodiment, the transistor T1 is used as a switch element, and any other suitable switch element can be used as a replacement, depending on practical requirements.

For testing different RF circuit characteristics, the duty cycle of the testing signal may need to be adaptively adjusted. With the specifically designed testing signal Ts, if the impedance of the RF circuit is normal, the rectified signal Ws, which includes the DC bias voltage, is able to drive the transistor T1 to be enabled, and if the impedance is abnormal, the transistor T1 cannot be enabled by the rectified signal Ws. Accordingly, whether the impedance of the RF circuit to be tested is normal as designed can be determined according to the output electric level Vout. For example, if the transistor T1 is successfully enabled in response to the rectified signal Ws, the RF circuit is determined to be normal, and on the other hand, if the transistor T1 cannot be enabled with the rectified signal Ws, the RF circuit is determined to be abnormal, e.g. short circuit. Whether the transistor T1 is successfully enabled or not can be realized according to the output electric level Vout. A low level, e.g. approximating ground level in this example, detected at the external output indicates a conductive state, and a high level, e.g. approximating working level VDD in this example, detected at the external output indicates a non-conductive state. The condition of the RF circuit can thus be readily discriminated by detecting the output electric level Vout.

In another embodiment, the testing-result informing unit 358 does not include the DC detecting unit 382. In this case, the rectified signal Ws is directly used for providing the contents of the informing signal. In other words, by coupling the rectified signal Ws to an analog-to-digital converter (not shown), the testing-result informing unit 358 may give the output of the analog-to-digital converter as the informing signal. Optionally, lighting alarm, sounding alarm or any other suitable type of alarm may accompany the informing signal.

Alternatively, an oscilloscope may be integrated into the testing circuit 35 to display the rectified signal Ws as the informing signal. Since a common oscilloscope is relatively bulky, it is suitable to combine the oscilloscope with the testing circuit 35 to constitute an integral and portable automation testing apparatus. The automation testing apparatus can be used not only for routine testing operations of RF circuits in a factory but also for maintenance of RF circuits outside the factory.

Figure 4:
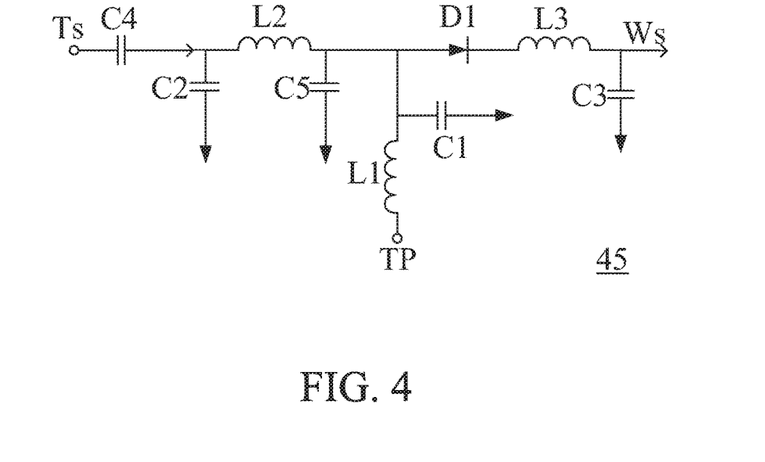
FIG. 4 is a circuit diagram schematically illustrating a testing circuit according to another embodiment of the present invention.

Please refer to FIG. 4, which is a circuit diagram schematically illustrating a testing circuit according to another embodiment of the present invention. With the comparison of FIG. 4 with FIG. 3, it can be seen that the DC detecting unit 382 shown in FIG. 3 is not included in the testing circuit 45 shown in FIG. 4. The testing circuit 45 further differs from the testing circuit 35 in two capacitors C4 and C5. In the embodiment shown in FIG. 4, the capacitor C5 functions as the testing-signal smoothing unit 154. In other words, the capacitor C5 functions for temporary energy storage for providing a basic DC voltage, i.e. the aforementioned DC bias signal, required by the testing-result informing unit 358 at a subsequent stage. In spite the capacitors C1 and C2 also exhibit functions of temporary energy storage and wave filtration, it is desirable to adjust the magnitude of the DC bias signal in the subsequent circuit by independently adjusting the capacitance of the capacitor C5 without adversely affecting the filtering performance. On the other hand, By alternate-current coupling, the capacitor C4 functions to reject the DC bias into the testing-signal generating unit (not shown) when the RF circuit 100 is an active load to give the DC bias.

As described above, the testing circuit 45 does not include the electronic elements relevant to the DC detecting unit 382 shown in FIG. 3. Therefore, the rectified signal Ws itself or the output of an additional analog-to-digital converter in response to the rectified signal Ws can be used as the informing signal. Optionally, lighting alarm, sounding alarm or any other suitable type of alarm may be activated based on the value or derived parameter of the rectified signal Ws.

In the above embodiments, a half-wave rectifier is used as the rectifying unit. Nevertheless, it is known to those skilled in the art that any other suitable type of rectifier, e.g. full-wave rectifier or bridge rectifier, may alternatively be used as the rectifying unit.

Figure 5:
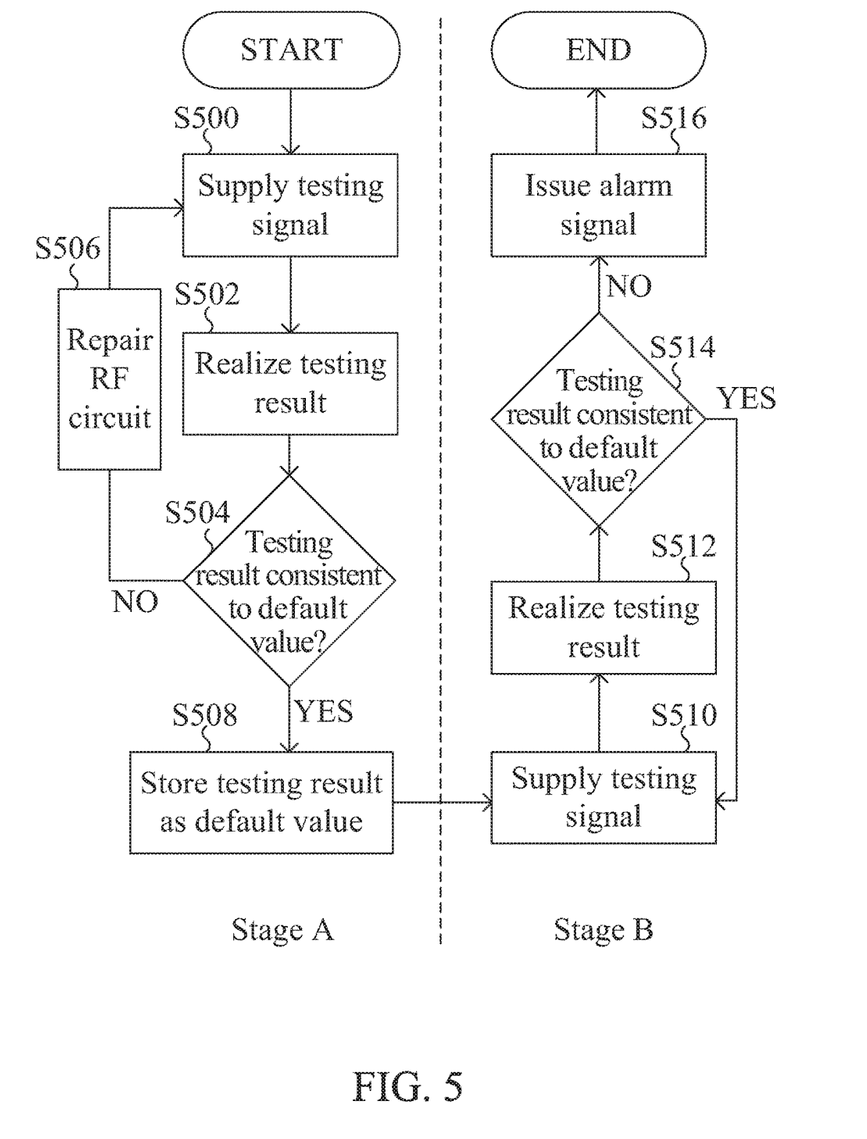
FIG. 5 is a flowchart schematically illustrating a testing method according to an embodiment of the present invention.

Afterwards, please refer to the flowchart shown in FIG. 5. A testing method according to an embodiment of the present invention is illustrated. In this embodiment, the testing method includes a stage A and a stage B as shown. The stage A is an RF circuit generally performed in a factory, while the stage B is performed during the normal operation of the RF circuit. It is to be noted that the stages A and B described above are only examples and not to be limited thereto. For better understanding, the method will be described further with reference to FIG. 1 as follows.

In the embodiment of the testing method illustrated in FIG. 5, a testing signal is first supplied to the testing circuit 150 (Step S500) in the Stage A. Then a testing result, i.e. the informing signal, is realized from the testing-result informing unit 158 (Step S502), as described above. In Step S504, the testing result is compared with a default value, which is a theoretical value complying with the circuitry design. If the difference between the testing result and the default value exceeds a threshold, proceed to Step S506 to have the RF circuit repaired, and then go back to Step S500 to do the test again. On the other hand, if the testing result is determined to be consistent to the default value, e.g. the difference is below the threshold, in Step S504, proceed to Step S508 to store the testing result as the default value for subsequent comparison in Stage B. Although it is feasible to still use the theoretical value in the Stage B for comparison with further testing results, the use of the previously certified testing result as the default value would make the subsequent tests more accurate because the possible deviations resulting from manufacturing errors of the RF circuits can be inherently removed by the replacement of default value for comparison.

After the default value is updated and stored in Step S508, the RF device 10 is ready for delivery to the consumer. The RF device 10, after being successfully installed and starting to operate, can automatically perform the testing procedures of Stage B. In Stage B, a testing signal is supplied to the testing circuit 150 (Step S510). Then a testing result is realized from the testing-result informing unit 158 (Step S512). In Step S514, the testing result is compared with the new default value. If the testing result is determined to be consistent to the new default value, e.g. the difference between the testing result and the default value is below a threshold, go back to Step S510 for next test. On the other hand, if the testing result is determined to be inconsistent to the new default value, e.g. the difference exceeds the threshold, in Step S514, proceed to Step S516 to issue an alarm signal for requiring notice, repair or maintenance. Optionally, the RF circuit 100 may be disabled by the alarm signal in some design.

In the above embodiment, the comparing operations in Step S504 and Step S514 can be performed by a processor disposed inside or outside the RF device 10. The processor, if being inside the RF device 10, may be independent from or integrated with the testing-signal generating unit 152. Alternatively, the comparing operations in Step S504 and Step S514 can be performed with hardware circuitry. Take the DC detecting unit 382 shown in FIG. 3 as an example. If the testing result is consistent to the default value (or theoretical value), the output electric level Vout would be at a low level, and it is determined that the RF circuit is normal. In contrast, if the difference between the testing result and the default value exceeds the threshold, the output electric level Vout would be at a high level. With a hardware circuit which is capable of interpreting the output electric level Vout and taking corresponding actions, the alarm signal can be optionally issued without any additional processor.

It is to be noted that in the above embodiments, the abnormal condition of the RF circuit indicates a short-circuit defect. However, other kinds of defects, e.g. open-circuit, may also be detected by the testing circuit and method according to the present invention with minor modifications. The principles for detecting short-circuit and open-circuit are actually the same except that the impedance values may vary with the frequencies of the testing signals. Therefore, by varying the testing signal, whether the RF circuit is short-circuit or open-circuit can be determined.

To sum up, according to the present invention, a filter unit is used to isolate the RF circuit from the testing circuit. Therefore, during the operation of the testing circuit, the application frequency of the testing signal would not be so high as to affecting the RF signal of the RF circuit adversely. Accordingly, the testing operation can be performed without affecting the normal operation of the RF circuit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A testing circuit performing a testing operation to determine an RF circuit characteristic of an RF device, comprising:
   a first filter unit having a first external terminal electrically coupled to a testing signal and a second external terminal electrically coupled to an RF circuit of the RF device, wherein the first filter unit is configured to allow the testing signal to enter the RF circuit while blocking an RF signal transmitted in the RF circuit from entering the testing circuit the first filter unit is configured to allow bidirectional transmitting of the testing signal, and a frequency of the testing signal is different from a frequency of the RF signal; and
   a testing-result informing unit having an external input electrically coupled to the first external terminal, and generating an informing signal, which indicates the RF circuit characteristic, according to an electric level at the external input.

2. The testing circuit according to claim 1, further comprising:
   a second filter unit having a third external terminal electrically coupled to the testing signal and a fourth external terminal electrically coupled to the first external terminal of the first filter unit.

3. The testing circuit according to claim 1, wherein the testing-result informing unit includes:
   a rectifying unit electrically coupled to the external input for rectifying the electric level at the external input to output a rectified signal; and
   a DC detecting unit electrically coupled to the rectifying unit for receiving the rectified signal, and outputting the informing signal according to the rectified signal.

4. The testing circuit according to claim 3, wherein the DC detecting unit includes:
   a switch element having a control terminal receiving therefrom the rectified signal, a first path electrically coupled to an external output, and a second path electrically coupled to a first default electric level, wherein whether to conduct the electric path between the first path and the second path or not is determined according to the rectified signal; and
   a voltage drop element having one terminal electrically coupled to a second default electric level and another terminal electrically coupled to the first path.

5. The testing circuit according to claim 1, further comprising:
   a testing-signal generating unit for generating and providing the testing signal.

6. The testing circuit according to claim 1, further comprising:
a testing-signal smoothing unit having one terminal electrically coupled to the testing signal and the first external terminal of the first filter unit.

7. An RF device, comprising:
an RF circuit for transmitting or receiving an RF signal;
a testing circuit performing a testing operation to detect an RF circuit characteristic of the RF device, comprising:
a first filter unit having a first external terminal electrically coupled to a testing signal and a second external terminal electrically coupled to the RF circuit, wherein the first filter unit is configured to allow the testing signal to enter the RF circuit while blocking an RF signal transmitted in the RF circuit from entering the testing circuit the first filter unit is configured to allow bidirectional transmitting of the testing signal, and a frequency of the testing signal is different from a frequency of the RF signal; and
a testing-result informing unit having an external input electrically coupled to the first external terminal, and generating an informing signal, which indicates the RF circuit characteristic according to an electric level at the external input.

8. The RF device according to claim 7, further comprising:
a second filter unit having a third external terminal electrically coupled to the testing signal and a fourth external terminal electrically coupled to the first external terminal of the first filter unit.

9. The RF device according to claim 7, wherein the testing-result informing unit includes:
a rectifying unit electrically coupled to the external input for rectifying the electric level at the external input to output a rectified signal; and
a DC detecting unit electrically coupled to the rectifying unit for receiving the rectified signal, and outputting the informing signal according to the rectified signal.

10. The RF device according to claim 7, further comprising:
a testing-signal generating unit for generating and providing the testing signal.

11. The RF device according to claim 7, further comprising:
a testing-signal smoothing unit having one terminal electrically coupled to the testing signal and the first external terminal of the first filter unit.

12. A testing method for determining an RF circuit characteristic of an RF device, executed by a testing circuit built in the RF device and electrically coupled to an RF circuit of the RF device, the testing method comprising:
electrically coupling a testing circuit to the RF circuit in the RF device;
receiving a testing signal;
transmitting the testing signal through both the testing circuit and the RF circuit while blocking an RF signal transmitted in the RF circuit from entering the testing circuit, wherein the testing signal is allowed to be transmitted from the testing circuit to the RF circuit and from the RF circuit to the testing circuit, and a frequency of the testing signal is different from a frequency of the RF signal;
generating an informing signal in response to the testing signal transmitted through the testing circuit and the RF circuit;
comparing the informing signal with a default signal to obtain a comparison result; and
determining the RF circuit characteristic according to the comparison result.

13. The testing method according to claim 12, further comprising:
updating the default signal the informing signal for a subsequent testing operation if a normal condition of the RF circuit is determined according to the comparison result.

14. The testing method according to claim 13, wherein the RF circuit characteristic is determined to be a normal condition if the comparison result indicates that the informing signal is consistent to the default signal, and determined to be an abnormal condition if the comparison result indicates that the informing signal is inconsistent to the default signal.

15. The testing method according to claim 14, wherein the abnormal condition is a short-circuit condition or an open-circuit condition, which is selectively determined with a variable testing signal.

\* \* \* \* \*